United States Patent [19]
Williams

[11] Patent Number: 5,939,752
[45] Date of Patent: Aug. 17, 1999

[54] LOW VOLTAGE MOSFET WITH LOW ON-RESISTANCE AND HIGH BREAKDOWN VOLTAGE

[75] Inventor: Richard K. Williams, Cupertino, Calif.

[73] Assignee: Siliconix Incorporated, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/570,876

[22] Filed: Dec. 12, 1995

[51] Int. Cl.⁶ .................................................. H01L 29/76
[52] U.S. Cl. ............................ 257/339; 257/341; 257/342
[58] Field of Search .................................... 257/339, 341, 257/342, 343, 338

[56] References Cited

U.S. PATENT DOCUMENTS

| | | |
|---|---|---|
| 4,366,495 | 12/1982 | Goodman et al. |
| 4,376,286 | 3/1983 | Lidow et al. ........................ 357/23 |
| 4,593,302 | 6/1986 | Lidow et al. ........................ 357/23.4 |
| 4,642,666 | 2/1987 | Lidow et al. ........................ 357/23.4 |
| 4,680,853 | 7/1987 | Lidow et al. ........................ 29/571 |
| 4,705,759 | 11/1987 | Lidow et al. ........................ 437/29 |
| 5,053,838 | 10/1991 | Fijihira ................................. 257/338 |
| 5,229,634 | 7/1993 | Yoshioka et al. .................... 257/342 |

FOREIGN PATENT DOCUMENTS

| | | |
|---|---|---|
| 60-107866 | 6/1985 | Japan . |
| 62-101076 | 5/1987 | Japan . |
| 63-084069 | 4/1988 | Japan . |
| 63-133678 | 6/1988 | Japan . |
| 1-209766 | 8/1989 | Japan . |
| 2-005485 | 1/1990 | Japan . |

*Primary Examiner*—Minh Loan Tran
*Attorney, Agent, or Firm*—Skjerven, Morrill, MacPherson, Franklin & Friel LLP; David E. Steuber; Hugh H. Matsubayashi

[57] ABSTRACT

A low voltage power MOSFET is disclosed which includes spaced apart base regions defining a conduction region therebetween. A highly doped region is provided adjacent the conduction region and is spaced from the base regions, being substantially equidistant thereto and extending therebelow. The spacing of the highly doped region from the base regions provides enhanced conductivity of the device and avoids the problem of device breakdown and punch-through in regard to the source regions of the low voltage power device.

9 Claims, 6 Drawing Sheets

LOW VOLTAGE MOSFET WITH LOW ON-RESISTANCE AND HIGH BREAKDOWN VOLTAGE

BACKGROUND OF THE INVENTION this invention relates to vertical MOSFET technology, and more particularly, to vertical MOSFET devices which are particularly useful in low voltage applications.

BACKGROUND OF THE INVENTION

In the past, attempts have been made to produce a high power MOSFET which combines low on-resistance with a reasonably high breakdown voltage. Reference is made, for example, to U.S. Pat. Nos. 4,376,286, 4,593,302, 4,680,853, 4,642,666, and 4,705,759, all assigned to International Rectifier Corporation.

As disclosed therein, and as shown in FIG. 1., a MOSFET device 10 includes an N+ silicon substrate 12 having an N- epitaxial layer 14 thereon, with spaced-apart type P body or base regions 16 formed in the epitaxial layer 14. N+ source regions 18 are formed in the base regions 16, with the base regions 16 having therebetween a highly doped, enhanced conductivity N type common conduction region 20. Each base region 16 has a channel region 22 between its associated source region 18 and the highly doped region 20. The device 10 includes a gate oxide 24, a polysilicon gate electrode 26, oxide 28 over the gate electrode 26, a metal contact layer 30, and a remote conductive drain region 32 contacting the substrate 12, all as is well known. The highly doped region 20 extends completely between and contacts base regions 16 and is defined to a particular depth which is greater than the depth of the source regions 18 but less than the depth of the base regions 16.

While such a device 10 has been found to provide somewhat lower on resistance, the doping concentration of the enhanced conductivity region 20 in fact can be increased only slightly beyond that of the epitaxial layer 14 without significantly affecting the breakdown voltage of the device 10. Thus, the use of such a feature in a high voltage device, wherein the epitaxial layer is lightly doped, has been limited to doping the enhanced conductivity region to a range that would be equivalent to a threshold adjust.

However, in application of such a feature to a low voltage power MOSFET device such as those being used, for example, in disk drives, cellular phones, desktop computers, and laptop computers, problems have arisen. Such a low voltage device includes a relatively highly doped epitaxial layer, making the additional doping of the enhanced conductivity region of limited consequence. If the doping level of the enhanced conductivity region is raised substantially over the doping level of the epitaxial layer, the breakdown along the base region junction with the epitaxial layer will degrade and punchthrough might occur between a source region and the heavily doped region, because one is forced to incorporate a relatively lightly doped base region.

Thus, the structure of prior art is not readily applicable to low voltage devices.

SUMMARY OF THE INVENTION

In the present invention, a low voltage power MOSFET device includes a highly doped enhanced conductivity region which is spaced from and does not abut or contact the base regions of the device. Such a structure is particularly adaptable to low-voltage devices, in that the doping of the enhanced conductivity region will be high enough to provide enhanced conductivity of the device, but with the problem of breakdown along the base junction and punchthrough of the device being averted.

DESCRIPTION OF THE PREFERRED EMBODIMENTS

Figure 1:
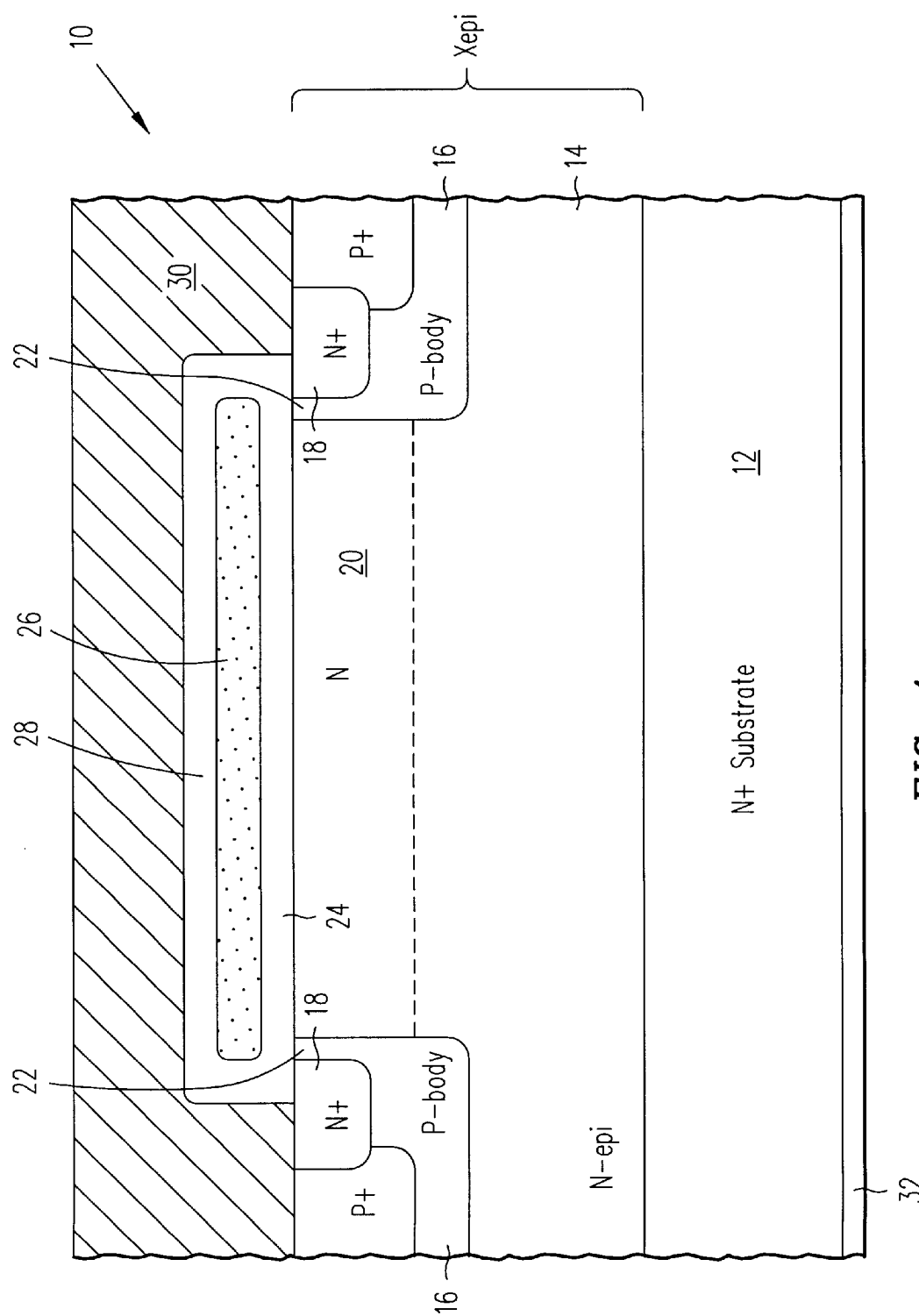
FIG. 1 is a sectional view of a prior art device as described above.
Figure 2:
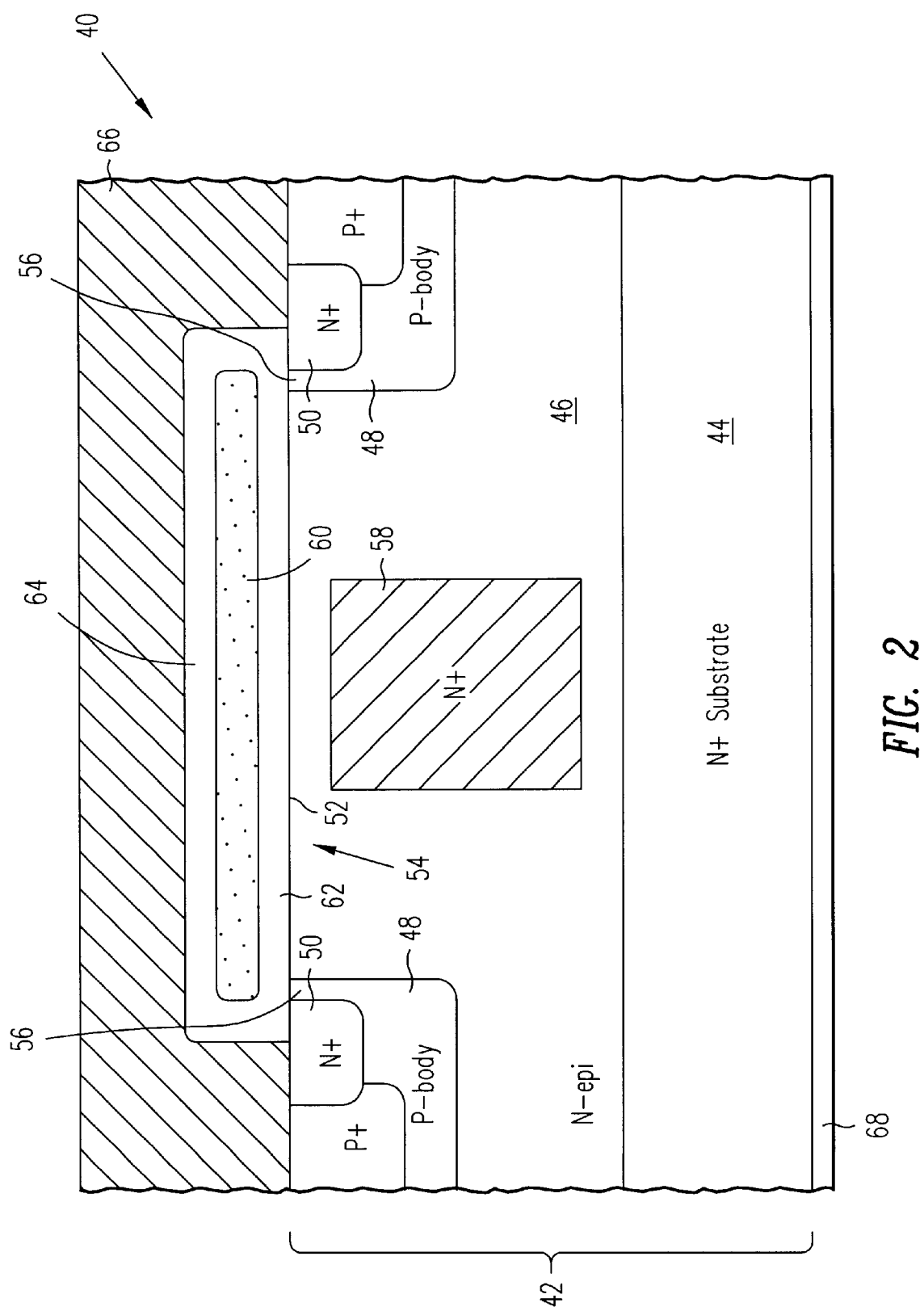
FIG. 2 is a sectional view of a device incorporating a first embodiment of the invention.
Figure 3A:
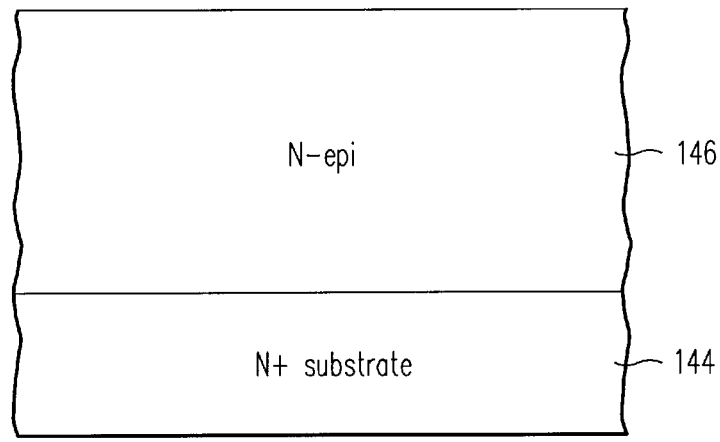
FIGS. 3(a)–3(g) show a method for fabricating the device of FIG. 2.
Figure 3B:
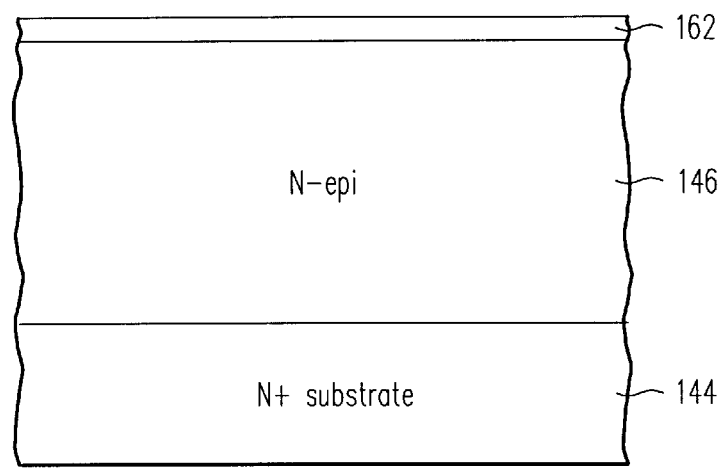
Figure 3C:
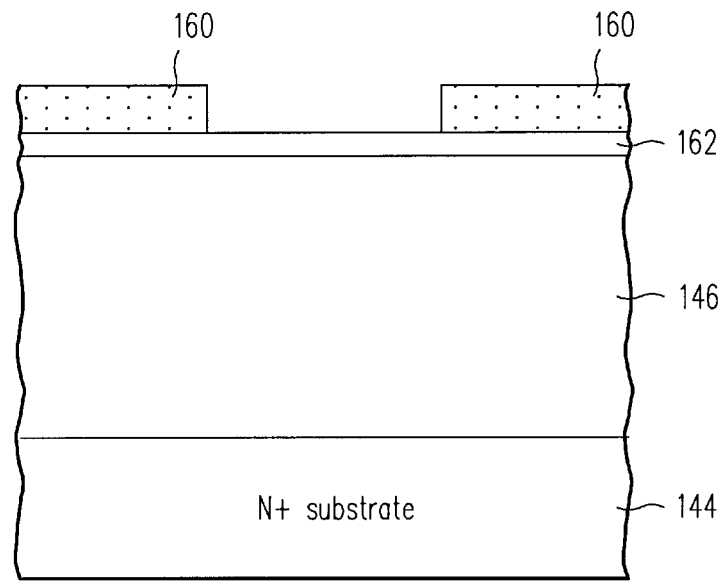
Figure 3D:
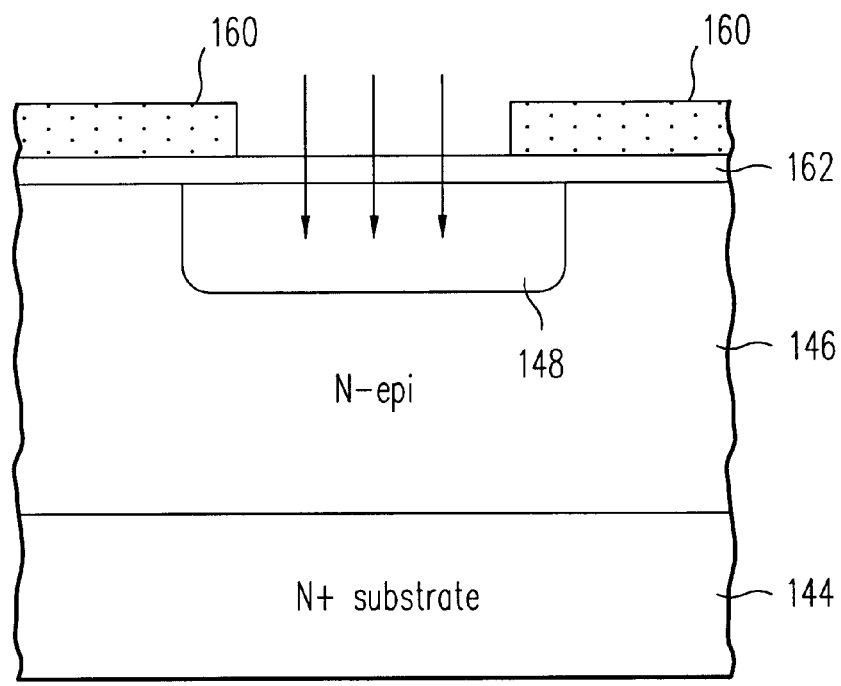
Figure 3E:
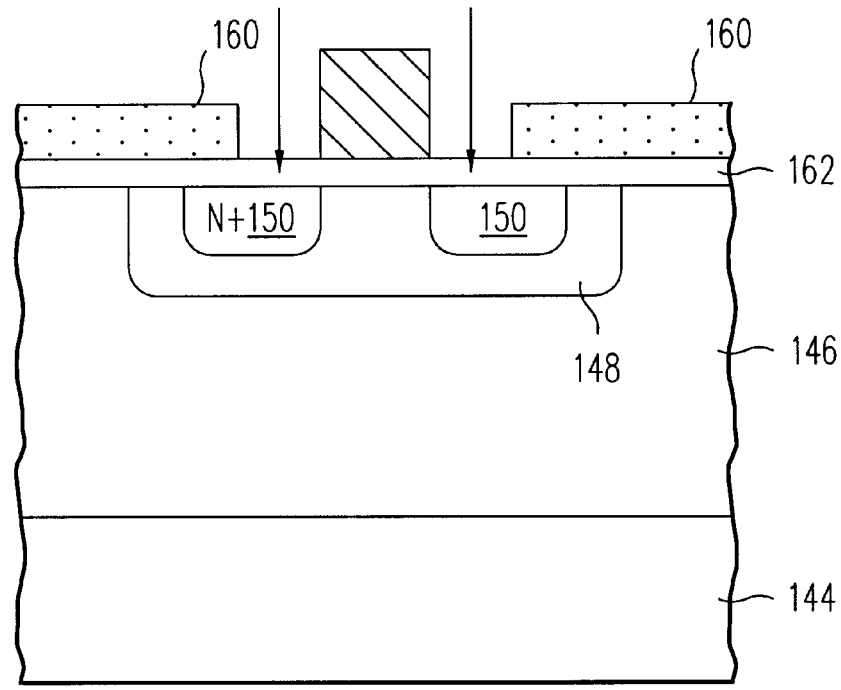
Figure 3F:
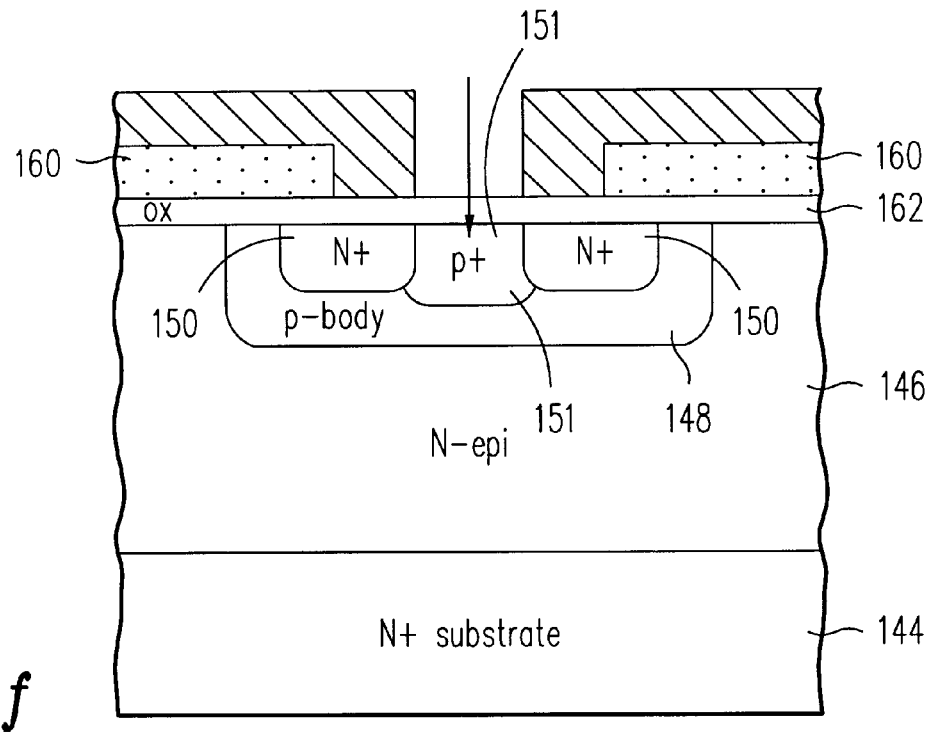
Figure 3G:
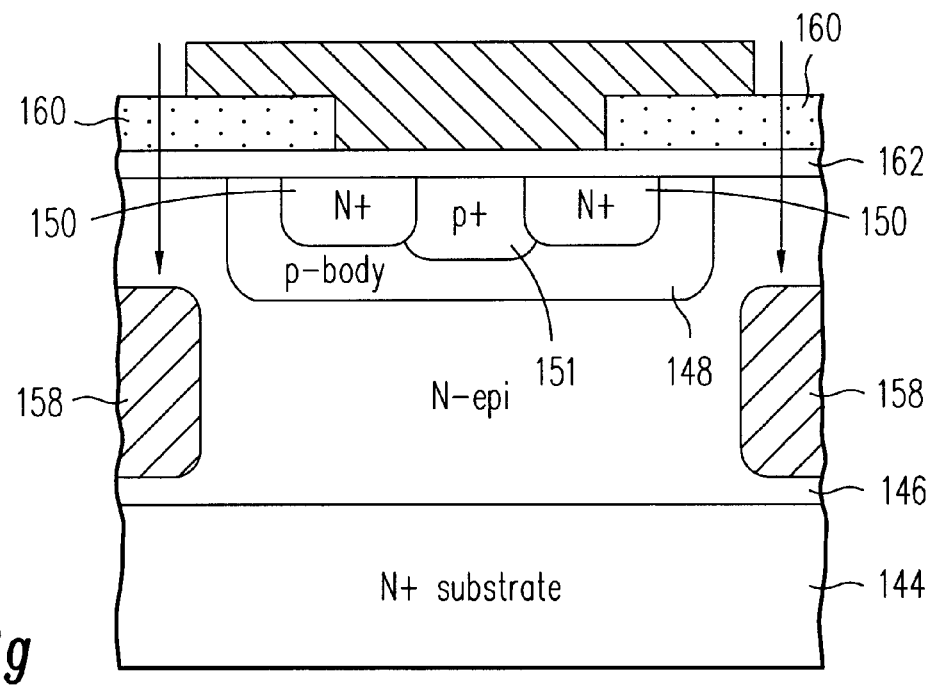

With reference to FIG. 2, shown therein is a low-voltage, high power MOSFET device 40 in accordance with a first embodiment of the invention. Such a device 40 includes a semiconductor body 42 including an N+ substrate 44 having an N- epitaxial layer 46 formed thereover. The N- epitaxial layer 46 may be relatively highly doped to a level of $5\times10^{15}$–$1\times10^{17}$ atoms/cm$^3$. The epitaxial layer 46 includes first and second spaced-apart P type body or base regions 48, which base regions 48 contain respective first and second N+ source regions 50. The base regions 48 are in lateral spaced-apart relation to each other along the surface 52 of the epitaxial layer 46 to form a conduction region 54 therebetween. The source regions 50 extend to the surface 52 and are laterally spaced along the surface 52 from the respective adjacent edges of the conduction region 54. The portions of the base regions 48 adjacent the surface 52 of the epitaxial layer 46 define channel regions 56 between the respective source region 50 and the conduction region 54, as is well known.

The epitaxial layer 46 contains therewithin a highly doped N+ enhanced conductivity region 58 adjacent the conduction region 54. The highly doped region 58 has a portion positioned between the base regions 48 and extends to below the lowermost portions of the base regions 48, but is spaced from the innermost adjacent portions of the base regions 48 and is substantially equidistant thereto as shown in FIG. 2. The level of dopant of the highly doped region 58 would be in the range of at least a factor of two (to be noticeably beneficial) and typically one to two orders of magnitude higher than the doping level of the epitaxial layer 46.

Such highly doped region 58 may be formed in a number of ways. Typically, a high energy implant can be undertaken through the surface 52 of the epitaxial layer 46, after appropriate masking, and before or after formation of the polysilicon gate electrode 60 on the gate oxide 62, which both overlie the channel regions 56. The energy level of the implant would of course be dependant on the stage of device fabrication as the implant is undertaken.

When implanting through the surface 52 of the epitaxial layer 46 without the polysilicon gate electrode 60 in place, in an N channel device, phosphorus may be implanted in a dose of $1\times10^{14}$ atoms/cm$^2$ to $5\times10^{15}$ atoms/cm$^2$ at an energy level in the range of 400–800 KeV. When implanting through the polysilicon gate electrode 60, the appropriate energy level range would be approximately doubled.

In the case of a P channel device, i.e., with all conductivity types reversed, in the case where the implant takes place into the surface of the epitaxial layer without the polysilicon gate electrode in place, the appropriate dose of, for example, boron would again be $1\times10^{14}$ atoms/cm$^2$ to $5\times10^{15}$ atoms/cm$^2$ at an implant energy of 200–400 KeV. In such a device, when implanting through the polysilicon gate electrode, the appropriate range of energy level would be approximately doubled.

In both cases, a diffusion step is of course undertaken to form the enhanced conductivity region to the shape shown in FIG. 2. While the implant dose and range disclosed has,been selected to achieve a noticeable beneficial reduction in on resistance, implanting a lower dose may still show some improvement but with reduced benefit.

The spacing between the highly doped region 58 and each base region 48 is chosen to be approximately the same as the spacing between each base region 48 and the substrate 44. The spacing is determined by any method which prevents, the implant from penetrating in the source body region. The lateral extent could be limited by a photomask defined layer of organic photoresist or a photolithographically defined layer of oxide.

The device 40 further includes oxide 64 over the gate electrode 60, a metal contact layer 66, and a remote conductive drain region 68 on the backside of the substrate 44 all as is well known. Alternatively a topside drain contact remotely located laterally could be used.

The inclusion of such highly doped region 58 spaced from the base regions 48 decreases on resistance of the device 40 and avoids the problem of device breakdown and punch-through in regard to the source regions as described above.

Reference is made to FIGS. 3(*a*)–3(*g*) for a description of a method of fabricating the device of FIG. 2.

With reference to FIG. 3(*a*), an N– epitaxial layer 146 is grown on an N+ substrate 144 to a thickness of $\leq 10$ microns. A gate oxide 162 is grown on the epitaxial layer 146 (FIG. 3(*b*)), using dry $O_2$ at a temperature of 900° C. to 1050° C. for 20 minutes to 2 hours, to a thickness of 100 to 1000 Å. Then, with reference to FIG. 3(*c*), a polysilicon layer 160 is deposited over the epitaxial layer 146 by chemical vapor deposition, to a thickness of 2000 to 5000 Å. The polysilicon layer 160 is implanted with N+ material, or is doped with $POCl_3$, and then is masked and etched to the configuration shown in FIG. 3(*c*).

Next, a body or base 148 implant is undertaken using boron for an N channel device or phosphorus for a P channel device. The implant is undertaken at a dosage of $1\times10^{13}$–$1\times10^{14}$ atoms/cm$^2$ at an energy level of 20 to 100 KeV. After appropriate diffusion, further masking is undertaken and a source 150 implant (FIG. 3(*e*)) is undertaken, using arsenic or phosphorus for an N channel device or boron for a P channel device, at a dosage of $8\times10^{14}$–$7\times10^{15}$ atoms/cm$^2$, and at an energy level of 20–80 KeV.

Next, with reference to FIG. 3(*f*), a body or base contact 151 implant is undertaken subsequent to appropriate masking, using boron for an N channel device or arsenic for a P channel device, at a dosage of $1\times10^{14}$–$3\times10^{15}$ atoms/cm$^2$ and at an energy level of 20–80 KeV.

As shown in FIG. 3(*g*), a high energy JFET implant is then undertaken, in this case through the polysilicon gate electrode 160 and the oxide layer 162, and into the epitaxial layer 146. After diffusion of this implant, the highly doped regions 158 as shown and described in FIG. 2 are formed.

Figure 4:
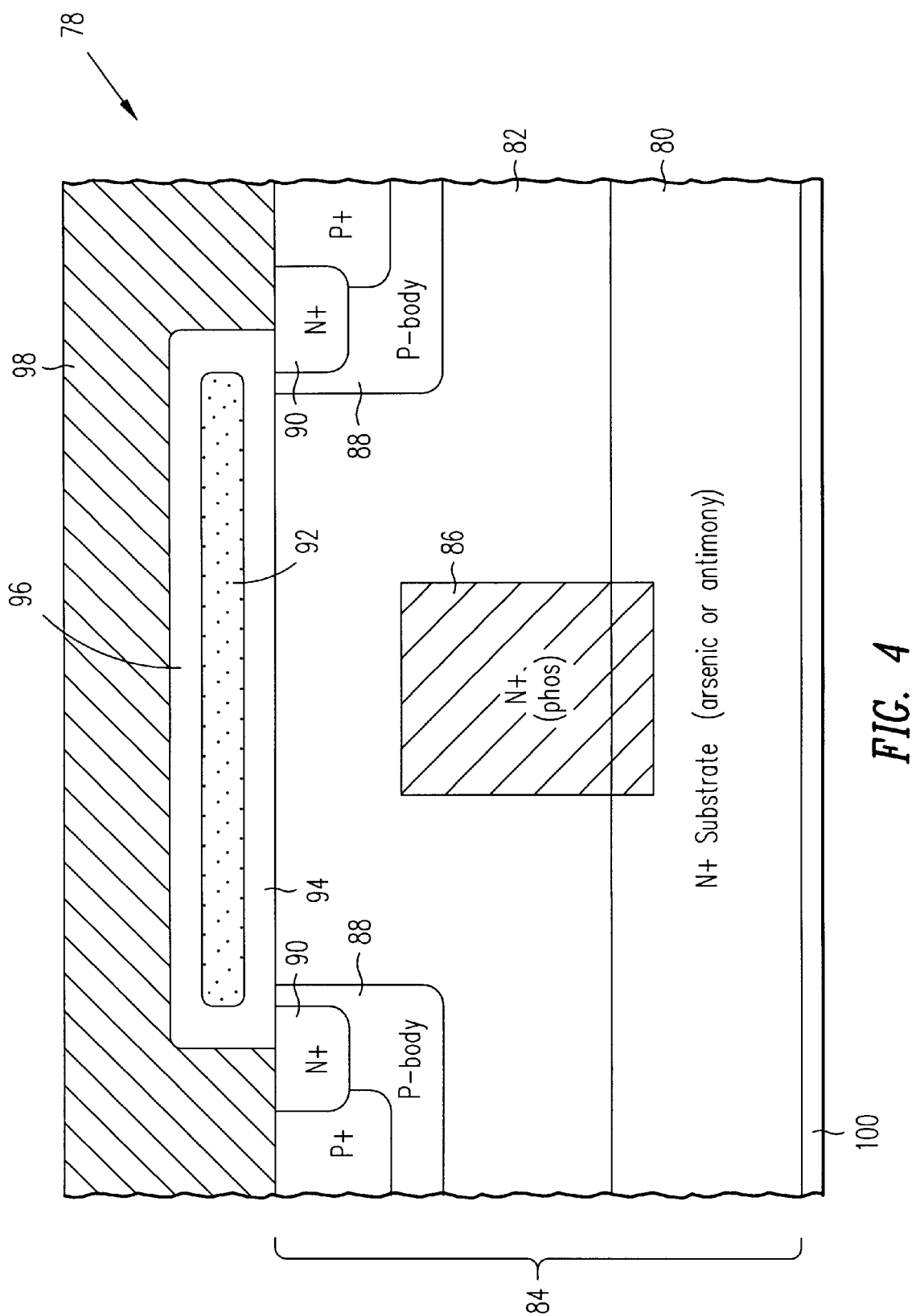
FIG. 4 is a sectional view of a device incorporating a second embodiment of the invention.

Reference is made to FIG. 4 showing a second device 78 including a second embodiment of the invention.

As shown therein, an N+ substrate 80 doped with arsenic or antimony is provided and is masked and implanted with phosphorus, and then an epitaxial layer 82 is grown. The substrate 80 and epitaxial layer 82 make up a semiconductor body 84. During the growth of the epitaxial layer 82, a highly doped enhanced conductivity region 86 is formed which extends partly into the substrate 80 and partly into the epitaxial layer 82, but, growing faster into the epitaxial layer 82 than the substrate 80, extends further into the epitaxial layer 82 than the substrate 80 in the completed device 78, and preferably near or above the bottom of the P base region and into the JFET region.

This device 78 also includes spaced body or base regions 88 and source regions 90 as described above, and a polysilicon gate electrode 92 on a gate oxide 94.

Oxide 96 over the gate electrode 92, a metal contact layer 98, and a drain contact 100 are included, as in the first embodiment. Again, one highly doped region 86 extends upward to between the base regions 88 and also extends below the lowermost portions of the base regions 88 and into the substrate 80, thus taking the form of a buried layer. As in the first embodiment, the distance between the base regions 88 and the highly doped region 86 is approximately the same as the distance between the base regions 88 and the substrate 80, and the highly doped region 86 is substantially equidistant to the base regions 88.

Similar to the device in FIG. 2, the inclusion of such a highly doped region 86 decreases on resistance of the device and avoids the problem of device breakdown and punch-through in regard to the source regions as described above, because of the spacing of the highly doped region 86 from the base regions 88.

I claim:

1. A power metal oxide semiconductor field effect transistor device comprising:

a semiconductor body having a semiconductor body surface, said semiconductor body being of a first conductivity type, wherein said semiconductor body comprises a substrate of said first conductivity type and a single epitaxial layer of said first conductivity type on said substrate;

first and second spaced base regions of a second conductivity type formed in said semiconductor body and extending from said semiconductor body surface, the space between said first and second base regions defining a conduction region of said first conductivity type having a conductive region lateral width, said first and second base regions each having a bottom surface;

first and second source regions of said first conductivity type formed respectively in said first and second base regions and extending from said semiconductor body surface, said first and second source regions being laterally spaced along said semiconductor body surface from the respective adjacent edges of the conduction region to define first and second channel regions along said semiconductor body surface between each of said first and second source regions respectively and said conduction region;

a gate insulation layer on said semiconductor body surface, disposed on said first and second channel regions;

a gate electrode on said gate insulation layer and overlying said first and second channel regions;

a drain conductive region remote from said conduction region;

a highly doped region of said first conductivity type adjacent said conduction region, and having a lateral width less than said conductive region width, said highly doped region being spaced from said first and second base regions wherein at least a portion of said highly doped region extends laterally between said base regions, and at least a portion of said highly doped region extends to a level above said bottom surfaces of said first and second base regions and at least a portion of said highly doped region extends to a level below said bottom surfaces of said first and second base regions.

2. The device of claim 1 wherein the highly doped region is disposed entirely within the single epitaxial layer.

3. The device of claim 2 wherein the distance between each base region and said substrate is substantially the same as the distance between that base region and the highly doped region.

4. The device of claim 1 wherein said highly doped region extends into said substrate and said single epitaxial layer.

5. The device of claim 4 wherein the highly doped region extends further into said single epitaxial layer than into said substrate.

6. The device of claim 3 wherein the distance between each base region and said substrate is substantially the same as the distance between that base region and the highly doped region.

7. The device of claim 1 wherein the portion of said highly doped region extending laterally between said base regions is approximately centrally disposed between said base regions so as to be spaced substantially equidistant to each of said base regions.

8. A power metal oxide semiconductor field effect transistor device comprising:

a semiconductor body having a semiconductor body surface, said semiconductor body being of a first conductivity type, wherein the semiconductor body comprises a substrate of said first conductivity type and a single epitaxial layer of said first conductivity type disposed on said substrate;

first and second spaced base regions of a second conductivity type formed in said semiconductor body and extending from said semiconductor body surface, the space between said first and second base regions defining a conduction region of said first conductivity type, said first and second base regions each having a bottom surface;

first and second source regions of said first conductivity type formed respectively in said first and second base regions and extending from said semiconductor body surface, said first and second source regions being laterally spaced along said semiconductor body surface from the respective adjacent edges of the conduction region to define first and second channel regions along said semiconductor body surface between each of said first and second source regions respectively and said conduction region;

a gate insulation layer on said semiconductor body surface, disposed on said first and second channel regions;

a gate electrode on said gate insulation layer and overlying said first and second channel regions;

a drain conductive region remote from said conduction region;

a highly doped region of said first conductivity type adjacent said conduction region within said single epitaxial layer and formed after said singe epitaxial layer is disposed on said substrate, at least a portion of said highly doped region extending to a level above said bottom surfaces of said first and second base regions and laterally between said first and second base regions, said portion being spaced from said first and second base regions, and at least a portion of said highly doped region extending to a level below said bottom surfaces of said first and second base regions.

9. The device of claim 8 wherein said highly doped region extends into said substrate.

* * * * *